(12) United States Patent
Osawa et al.

(10) Patent No.: US 7,601,471 B2
(45) Date of Patent: Oct. 13, 2009

(54) APPARATUS AND METHOD FOR CORRECTING PATTERN DIMENSION AND PHOTO MASK AND TEST PHOTO MASK

(75) Inventors: Morimi Osawa, Kawasaki (JP); Teruyoshi Yao, Kawasaki (JP); Hiroshi Arimoto, Kawasaki (JP); Satoru Asai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 542 days.

(21) Appl. No.: 11/156,592

(22) Filed: Jun. 21, 2005

(65) Prior Publication Data
US 2005/0233226 A1 Oct. 20, 2005

Related U.S. Application Data

(63) Continuation of application No. PCT/JP2004/007173, filed on May 26, 2004.

(30) Foreign Application Priority Data
May 26, 2003 (WO) .................. PCT/JP03/06512

(51) Int. Cl.
*G03C 5/00* (2006.01)
*H01L 21/00* (2006.01)
*G03B 27/68* (2006.01)
*G03F 1/00* (2006.01)

(52) U.S. Cl. .................. 430/30; 430/5; 430/311; 355/52

(58) Field of Classification Search .................. 430/5, 430/30, 311; 355/52
See application file for complete search history.

(56) References Cited

U.S. PATENT DOCUMENTS

| 6,370,679 | B1 * | 4/2002 | Chang et al. ........... 716/19 |
| 6,815,129 | B1 * | 11/2004 | Bjorkholm et al. ...... 430/30 |
| 2001/0017693 | A1 * | 8/2001 | Zheng et al. ............ 355/77 |

(Continued)

FOREIGN PATENT DOCUMENTS

JP 6-118614 4/1994

(Continued)

OTHER PUBLICATIONS

Patent Abstracts of Japan, Publication No. 2002148779 A, published on May 22, 2002.

(Continued)

*Primary Examiner*—Mark F Huff
*Assistant Examiner*—Jonathan Jelsma
(74) *Attorney, Agent, or Firm*—Fujitsu Patent Center

(57) ABSTRACT

The width values of transferred patterns of respective evaluation patterns transferred using a test photo mask (11) are calculated by first calculation unit (12) based on the relationship with the opening ratio of flare generation patterns. The distribution of the calculated width values of the respective transferred patterns is linearly approximated by second calculation unit (13) and the inclination thereof is calculated. On the basis of a table defining the inclination of the width values of the respective transferred patterns (the ratio of dimension fluctuation), the amount of correction is changed for each pattern by correction unit (14). Consequently, the amount of dimension fluctuation caused by local flares can be accurately calculated. This enables accurately performing pattern-dimension corrections against local flares.

18 Claims, 11 Drawing Sheets

U.S. PATENT DOCUMENTS

2003/0068565 A1    4/2003    Won-Tai et al.

FOREIGN PATENT DOCUMENTS

| | | |
|---|---|---|
| JP | 2002-353130 | 12/2002 |
| JP | 2003-100624 | 4/2003 |
| JP | 2004-163670 | 6/2004 |

OTHER PUBLICATIONS

Patent Abstracts of Japan, Publication No. 2000235248 A, published on Aug. 29, 2000.

Patent Abstracts of Japan, Publication No. 09319067 A, published on Dec. 12, 1997.

Patent Abstracts of Japan, Publication No. 2002311563 A, published on Oct. 23, 2002.

Form PCT/ISA/237—Written Opinion issued in corresponding International Application No. PCT/JP2004/007173.

Chinese Office Action mailed Oct. 31, 2008 for a related patent application.

* cited by examiner

FIG. 7A

<LFC TABLE : LINE>

| Line \ Space | 0.13≦Space<0.15 | 0.15≦Space<0.18 | 0.18≦Space |
|---|---|---|---|
| 0.10≦Line<0.11 | 0.20 | 0.24 | 0.28 |
| 0.11≦Line<0.12 | 0.20 | 0.23 | 0.27 |
| 0.12≦Line | 0.19 | 0.22 | 0.25 |

FIG. 7B

<LFC TABLE : I>

| Line \ Space | 0.13≦Space<0.15 | 0.15≦Space<0.18 | 0.18≦Space |
|---|---|---|---|
| 0.10≦Line<0.11 | 0.10 | 0.14 | 0.18 |
| 0.11≦Line<0.12 | 0.10 | 0.13 | 0.17 |
| 0.12≦Line | 0.09 | 0.11 | 0.15 |

FIG. 7C

<LFC TABLE : T>

| Line \ Space | 0.13≦Space<0.15 | 0.15≦Space<0.18 | 0.18≦Space |
|---|---|---|---|
| 0.10≦Line<0.11 | 0.13 | 0.17 | 0.21 |
| 0.11≦Line<0.12 | 0.13 | 0.16 | 0.20 |
| 0.12≦Line | 0.12 | 0.14 | 0.18 |

APPARATUS AND METHOD FOR CORRECTING PATTERN DIMENSION AND PHOTO MASK AND TEST PHOTO MASK

This application is a continuation of international application PCT/JP2004/007173 filed on May 26, 2004.

TECHNICAL FIELD

The present invention relates to an apparatus and method for correcting local flares which occur in exposing apparatuses when fabricating semiconductor devices, and to photo masks and test masks.

BACKGROUND ART

In fabricating semiconductor devices, desired patterns formed on a photo mask (reticle), with the photolithography, are transferred through a reducing optical system to a substrate including a photosensitive resist formed thereof. Then, the latent images of the transferred patterns are patterned utilizing the difference in the rate of solution by developing liquid between the exposed portion and the non-exposed portion and etching is applied to the transferred patterns to process desired wiring layers.

In order to transfer fine patterns with high accuracy with an exposing technique, the exposure light wavelength and the reticle construction are optimized and also the influences of adjacent patterns are calculated and corrected. Such corrections are referred to as optical proximity effect corrections (OPC), wherein the amount of correction is calculated by determining, from calculations or experiments, the influences of optical proximity effects (OPE), in consideration of illumination conditions (NA, Sigma) and exposure conditions (the resist material and the exposure light wavelength, etc.) of the exposing apparatus, and thus reticle dimensions are corrected to correct the transferred pattern images.

As a method for correcting mask-pattern utilizing such OPCs, for example, there is a method disclosed in Patent Document 1 which will be listed later. The method disclosed in Patent Document 1 creates OPC tables for respective pattern densities, calculates the pattern densities of subregions, the sub regions being created by dividing the exposure shot region into regions of a dimension of about a few hundred micrometers, and performs corrections utilizing different OPC tables for respective pattern density values.

However, there are flares in exposing apparatuses, which are components which can not be corrected by OPCs. Such flares in exposing apparatuses are caused by fine concavities and convexities on lenses, fluctuations in the refractive index of lenses and light reflected and scattered by the wafer surface. Such flares cause an amount of offset exposure corresponding to the opening ratio around the mask patterns, resulting in fluctuations in the transferred-pattern dimensions or reduction of the exposure margin.

More recently, occurrences of local flares depending on the conditions around respective patterns have been acknowledged as a problem. Such flares are referred to as so-called local flares and have been main cause of occurrences of unexpected fluctuations in the shapes and the line widths of transferred patterns since the distinctiveness of the lens material depending on the wavelength of used exposure light (short wavelengths represented as 193 nm) causes differences in the condition of light applied to patterns corresponding to the opening ratio around the patterns. Local flares caused by a pattern in a mask have influences within an area around the pattern with a dimension of about 50 micrometers. However, the area within which local flares have influences may vary in the future depending on the generation of exposing apparatuses and the exposure light wavelength. In addition, the influences of local flares vary depending on the portion on a photo mask since the influences of local flares vary corresponding to the opening ratio around the pattern. Therefore, the amount of fluctuations in the line width of a resist pattern varies depending on the position. Therefore, it is extremely difficult to correct the patterns of a photo mask taking account of the influences of local flares.

Further, the method of Patent Document 1 assumes globally occurring dimension fluctuations and therefore provides equal correction values for patterns with the same distance to adjacent patterns within sub regions of a dimension of about a few hundred micrometers, which may induce correction errors. For example, the sub regions 201 partitioned by solid lines in FIG. 11A and the sub regions 201 partitioned by solid lines in FIG. 11B have the same pattern density, although they have different placements of patterns 202 within the respective sub regions 201. Thus, the correction values for line patterns 203 placed at the center in FIG. 11A and the line patterns 203 placed at the center in FIG. 11B will be equal. This may cause correction errors in some cases and may also cause larger correction errors near the boundaries of the sub regions 201.

[Patent Document 1] Japanese Patent Application Laid-open No. 2002-148779
[Patent Document 2] Japanese Patent Application Laid-open No. 2000-235248
[Patent Document 3] Japanese Patent Application Laid-open No. Hei 09-319067
[Patent Document 4] Japanese Patent Application Laid-open No. 2002-311563

SUMMARY OF THE INVENTION

The present invention was made in view of the aforementioned problems and aims at providing an apparatus and method for correcting pattern-dimension which realize with high accuracy against local flares occurring in exposing apparatuses, and providing photo masks and test photo masks.

The apparatus for correcting pattern dimension according to the present invention is an apparatus for correcting local flares occurring in an exposing apparatus in fabricating a semiconductor device, in which the amount of corrections is varied for each pattern to be actually formed, on the basis of a table defining the ration of the dimension fluctuation corresponding to the amount of the flares, using by parameters of the pattern widths of evaluation patterns and the distances from the evaluation patterns to most adjacent patterns.

Another aspect of the apparatus for correcting pattern dimension according to the present invention is an apparatus for correcting local flares occurring in an exposing apparatus in fabricating a semiconductor device, and includes fluctuation amount evaluation unit for evaluating the ratio of the dimension fluctuation to the amount of the flares using parameters of the pattern widths of evaluation patterns and the distances from the evaluation patterns to most adjacent patterns; and correction unit for changing the amount of corrections for each pattern to be actually formed, on the basis of a table defining the ratio of the dimension fluctuation.

Preferably, the fluctuation amount evaluation unit is configured to include a test photo mask including a plurality of the evaluation patterns formed to have different pattern widths and different distances to adjacent patterns and flare generation patterns for generating local flares around the respective evaluation patterns; first calculation unit for calculating the width values of transferred patterns of the evaluation patterns transferred through the test photo mask, on the basis of the relationship with the opening ratio of the flare generation patterns; and second calculation unit for linearly approximating the distribution of the calculated width values of the respective transferred patterns, calculating the inclination thereof and utilizing the inclination for correction of flares.

A method for correcting pattern dimension according to the present invention is a method for correcting local flares occurring in an exposing apparatus in fabricating a semiconductor device in which the amount of corrections is varied for each pattern to be actually formed, on the basis of a table defining the ratio of the dimension fluctuation to the amount of flares with parameters of the pattern widths of evaluation patterns and the distances from the evaluation patterns to most adjacent patterns.

Another aspect of the method for correcting pattern dimension according to the present invention is a method for correcting local flares occurring in an exposing apparatus in fabricating a semiconductor device, including a fluctuation amount evaluation step for evaluating the ratio of the dimension fluctuation to the amount of flares using parameters of the pattern widths of evaluation patterns and the distances from the evaluation patterns to most adjacent patterns; and a correction step for changing the amount of corrections for each pattern to be actually formed, on the basis of a table defining said ratio of the dimension fluctuation.

A further aspect of the pattern dimension correcting method for correcting pattern dimension according to the present invention is a method for correcting local flares occurring in an exposing apparatus in fabricating a semiconductor device, including a fluctuation amount evaluation step for evaluating the ratio of the dimension fluctuation to the amount of flares using parameters of the pattern widths of evaluation patterns and the distances from the evaluation patterns to most adjacent patterns; and a correction step for changing the amount of corrections for each pattern to be actually formed, on the basis of a table defining said ratio of the dimension fluctuation.

A photo mask according to the present invention is fabricated using the method for correcting pattern dimension described above.

A test photo mask according to the present invention includes a plurality of evaluation patterns formed with parameters of the pattern widths of evaluation patterns and the distances to most adjacent patterns from the evaluation patterns; and flare generation patterns for generating local flares around the respective evaluation patterns, wherein the flare generation patterns for the respective evaluation patterns are formed to have different opening ratios.

A computer program according to the present invention is for causing a computer to execute a process for correcting local flares occurring in an exposing apparatus in fabricating a semiconductor device. The computer program is for causing a computer to execute a fluctuation amount evaluation step for evaluating the ratio of the dimension fluctuation to the amount of said flares using parameters of the pattern widths of evaluation patterns and the distances from said evaluation patterns to most adjacent patterns; and a correction step for changing the amount of corrections for each pattern to be actually formed, on the basis of a table defining said ratio of the dimension fluctuation.

A computer-readable storage medium according to the present invention stores the aforementioned computer program.

BRIEF DESCRIPTION OF THE DRAWINGS

FIG. 7A is a view illustrating an example of a local flare correction (LFC) table.

FIG. 7B is a view illustrating an example of a local flare correction (LFC) table.

FIG. 7C is a view illustrating an example of a local flare correction (LFC) table.

DETAILED DESCRIPTION OF THE PREFERRED EMBODIMENTS

The Basic Construction of the Present Invention

The present inventors have focused attention on the realization of accurate pattern-dimension corrections against local flare occurring in exposure apparatuses in fabricating semiconductor devices and have reached the following construction of the present invention.

As a method for calculating the influences of local flares, there has been considered a method in which, within a range of about a few tens of micrometers from a pattern experiencing the influences of local flares, the influences thereof propagating from an opening at a point in the pattern to the peripheral regions (Point Spread Functions) are approximated as a Gaussian distribution or the sum of a plurality of Gaussian distributions, and the point spread functions in the peripheral opening regions are determined by integrations using the area-density map method. The area-density map method divides an exposure shot region into a plurality of correction regions and calculates the opening ratios of the respective correction regions. More specifically, within a range of, for example, 100 micrometers from a pattern of interest within an exposure region, the region is divided into meshed correction regions with a side length of about a few micrometers, in this case 1 micrometer, and the opening ratios of the meshed regions are calculated assuming the opening ratio within each meshed region is uniform. This method can largely improve the process speed.

Also, as a method for calculating the amount of corrections for mask dimensions according to the amount of influences of local flares, it is possible to employ a method which performs corrections by simulating light-intensity distributions based on models. However, while such correcting method utilizing simulations enables accurate calculations of light-intensity distributions, it requires a long time for executing simulations of light-intensity distributions based on models and thus is difficult to utilize for complicated and large patterns. Therefore, as a method for performing relatively simple corrections, there is a method for approximating light-intensity distributions as trapezoid waves (trapezoid approximation). The present inventors have focused attentions on such trapezoid approximation and considered concepts for realizing accurate pattern corrections against local flares.

Figure 1A:
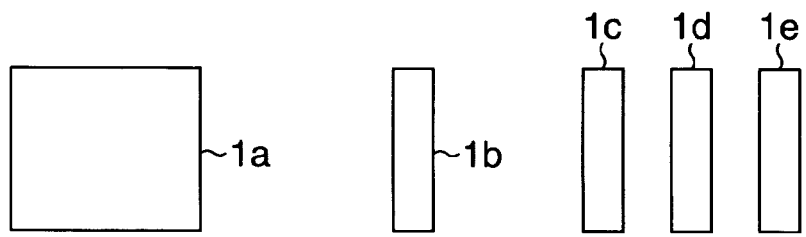
FIG. 1A is a conceptual view for explaining the basic construction of the present invention.
Figure 1B:
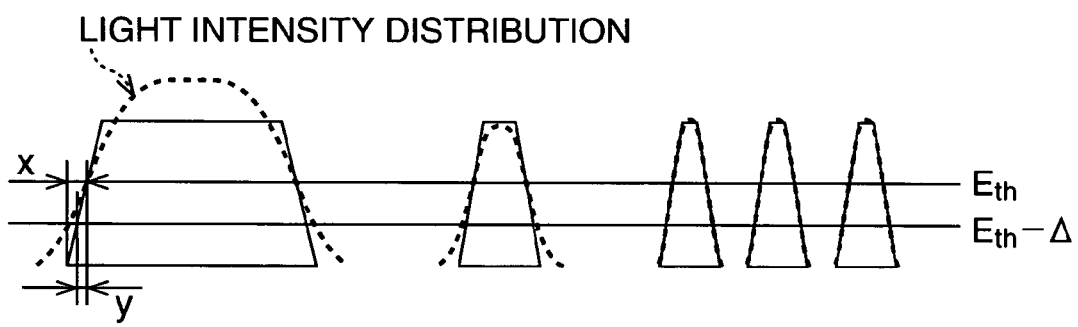
FIG. 1B is a conceptual view illustrating the basic construction of the present invention.
Figure 1C:
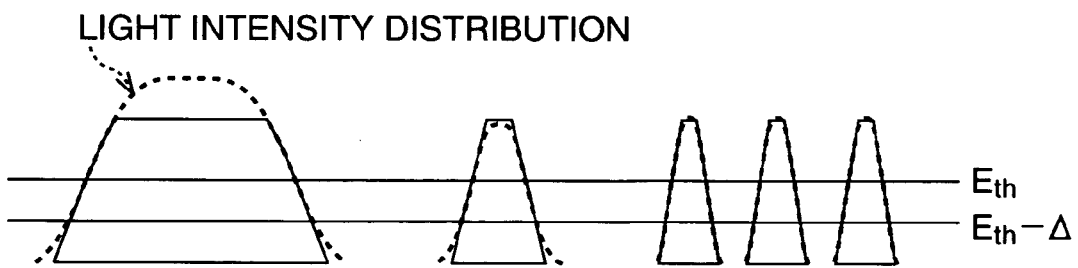
FIG. 1C is a conceptual view illustrating the basic construction of the present invention.

FIG. 1 is a conceptual view illustrating the basic construction of the present invention. FIG. 1A is a schematic view illustrating the mask pattern of a photo mask. FIG. 1B is a conceptual view illustrating a conventional correcting method. FIG. 1C is a conceptual view illustrating a correcting method according to the present invention.

With the conventional correcting method illustrated in FIG. 1B, when the light-intensity distributions in respective mask patterns 1a, 1b, 1c, 1d and 1e are approximated into trapezoids, the inclinations of the trapezoids near a threshold value $E_{th}$ (this is an energy value, and light intensities equal to or more than this energy value cause photo resists to be left) are always constant regardless of pattern widths. Namely, in the event that an amount of offset exposure Δ is caused by generated local flares corresponding to the opening ratio of the peripheral patterns, the amount of dimension fluctuations in the to-be-corrected pattern width for the amount of offset exposure Δ becomes constant regardless of the to-be-corrected pattern width, and consequently the amount of correction for the to-be-corrected pattern against local flares also becomes constant regardless of the pattern width. Consequently, for example, in the case of the to-be-corrected pattern with a large width (corresponding to the mask pattern 1a) illustrated at the leftmost position in FIG. 1B, the amount of dimension fluctuations (y) provided by the trapezoid approximation will have an error relative to the amount of dimension fluctuations (x) in the actual light-intensity distribution, thereby preventing accurate correction of the pattern dimension. In an actual light-intensity distribution, as illustrated in FIG. 1B, the inclination near the threshold value $E_{th}$ varies depending on the pattern width and the distances to adjacent patterns.

According to the present invention, in consideration of the characteristic of light-intensity distributions, the amounts of dimension fluctuations in to-be-corrected patterns are linearly approximated and calculated as inclinations based on the relationship with the opening ratio of the peripheral patterns. Further, such inclination are previously calculated corresponding to the pattern shapes, pattern widths, distances to adjacent patterns, etc., as $K_1\Delta, K_2\Delta, K_3\Delta, \ldots$ ($K_1, K_2, K_3$ are different constants each other), and a local-flare correction (LFC) table is created. Namely, the present invention enables changing the inclinations of approximation trapezoids depending on the to-be-corrected pattern. This enables accurate approximation of light-intensity profiles near the threshold value $E_{th}$, thus enabling accurate pattern-dimension correction taking account of local flares.

Concrete Embodiments Utilizing the Basic Construction of the Present Invention

Next, respective embodiments based on the basic construction of the present invention will be described.

The First Embodiment

Figure 2:
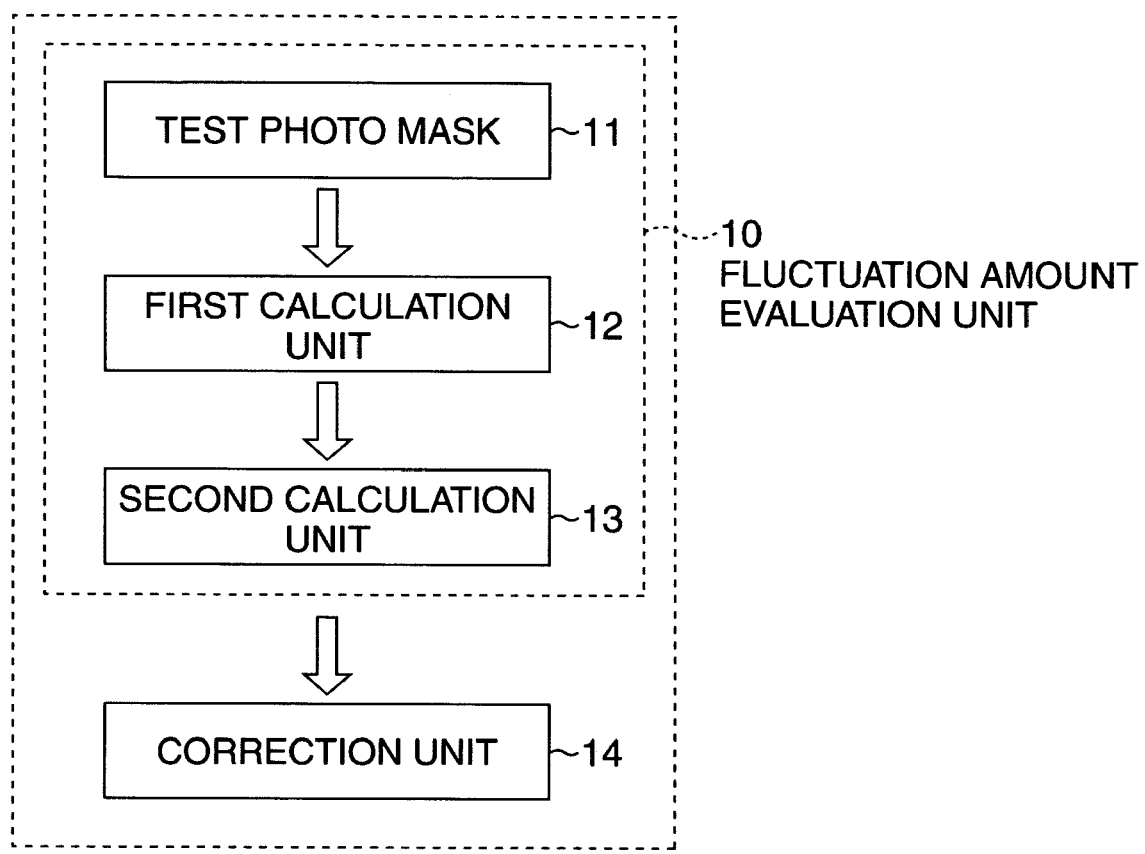
FIG. 2 is a block diagram illustrating the general structure of an apparatus for correcting pattern dimension according to a first embodiment.

FIG. 2 is a block diagram illustrating the general structure of a pattern-dimension correcting apparatus according to the first embodiment.

This pattern-dimension correcting apparatus is constituted by fluctuation amount evaluating unit 10, which includes a test photo mask 11 including a plurality of evaluation patterns and flare generation patterns for generating local flares around the respective evaluation patterns, first calculating unit 12 for calculating the width values of transferred patterns of the respective evaluation patterns transferred using the test photo mask 11 based on the relationship with the opening ratio of the flare generating pattern, and second calculating unit 13 for linearly approximating the distribution of the width values of the transferred patterns calculated by the first calculating unit 12 and for calculating the inclinations thereof, evaluates the amount of dimension fluctuations of the evaluation patterns with respect to the amount of local flares; and by the correcting unit 14 changes the amount of correction for respective patterns to be actually created, on the basis of tables defining the inclinations (the amounts of dimension variations) of the width values of the respective transferred patterns.

Figure 3:
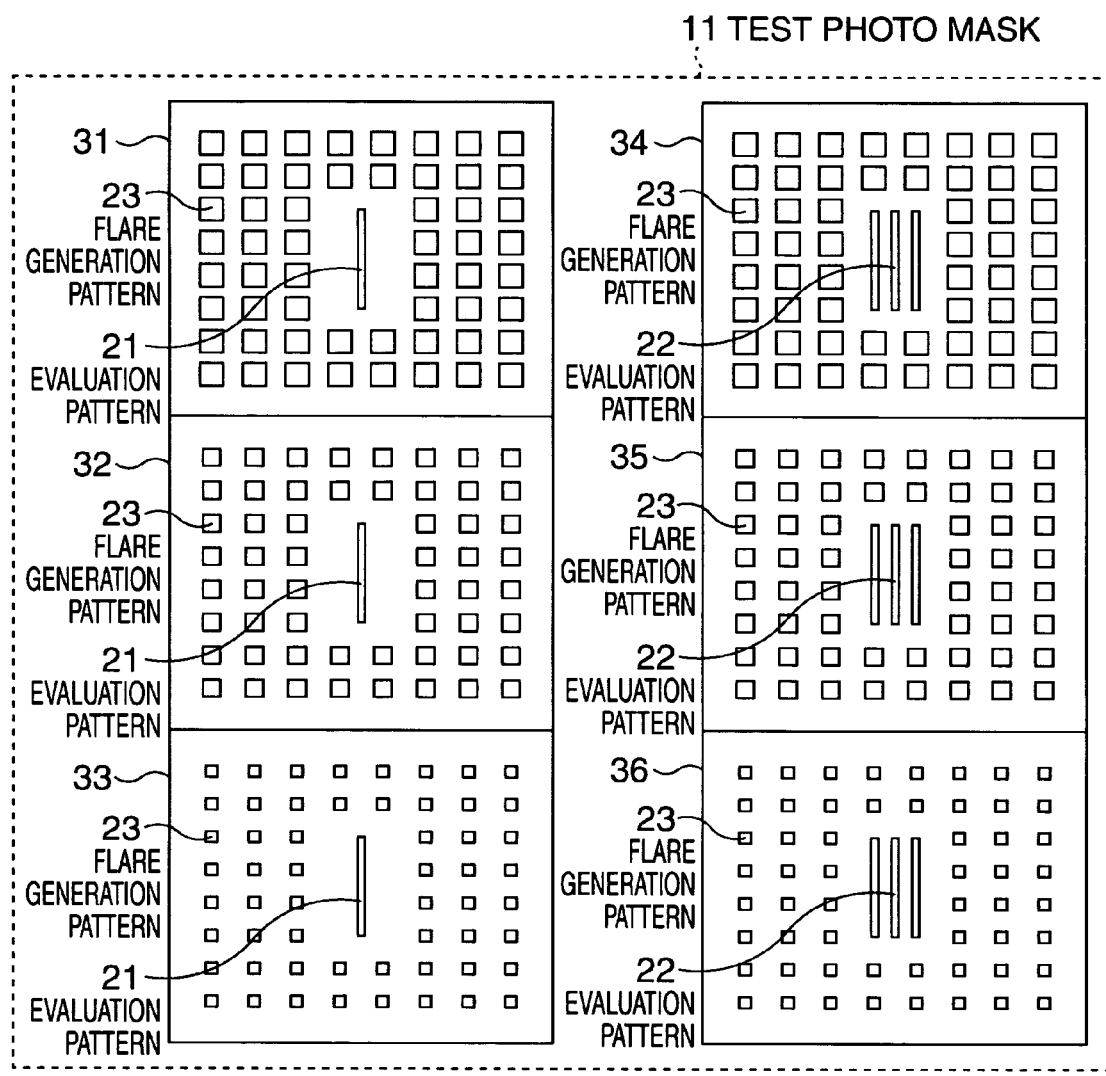
FIG. 3 is a schematic structure view of a test photo mask.

FIG. 3 is a schematic construction view of the test photo mask formed as an integral photo mask.

Evaluation pattern areas 31 to 33 in the test photo mask 11 each include an evaluation pattern 21 which is an isolated line-shaped pattern (hereinafter, simply referred to as an isolated pattern), wherein there is no other pattern within a predetermined range around the evaluation pattern 21. Evaluation pattern areas 34 to 36 in the test photo mask 11 each include an evaluation pattern 22 which is a line-and-space shaped pattern (hereinafter, simply referred to as an L/S pattern) constituted by a line pattern to be evaluated in terms of the dimension fluctuations thereof and a plurality of line patterns formed on the right and left sides of the to-be-evaluated line pattern in parallel therewith such that they are spaced apart by a predetermined interval from one another (In the example illustrated in the figure, there are three line patterns including the to-be-evaluated line pattern).

In the evaluation pattern areas 31 to 33 in the test photo mask 11, there are provided an identical evaluation pattern 21 which is an isolated pattern and flare generation patterns 23 for generating local flares around the evaluation pattern 21. The flare generation patterns 23 are for making the opening ratios of the evaluation pattern areas 31 to 33 to be different from one another and, more specifically, the opening ratio of the evaluation pattern area 31 provided by the flare generation patterns 23 is largest and the opening ratio of the evaluation pattern area 33 provided by the flare generation patterns 23 is smallest.

The evaluation pattern areas 34 to 36 in the test photo mask 11 are configured similarly to the evaluation pattern areas 31 to 33, except that the evaluation patterns 22 are L/S patterns. Thus, since in the evaluation patterns 31 to 33 and 34 to 36, there are placed the flare generation patterns 23 having different opening ratios around the evaluation patterns 21, 22, with controlling the amount of local flares in the evaluation patterns 21, 22 in correspondence with the opening ratios, it is able to determine the relationship between the amount of local flares and the amount of dimension fluctuations of the evaluation patterns 21, 22.

Next, a pattern-dimension correcting method according to the present embodiment will be described.

Figure 4:
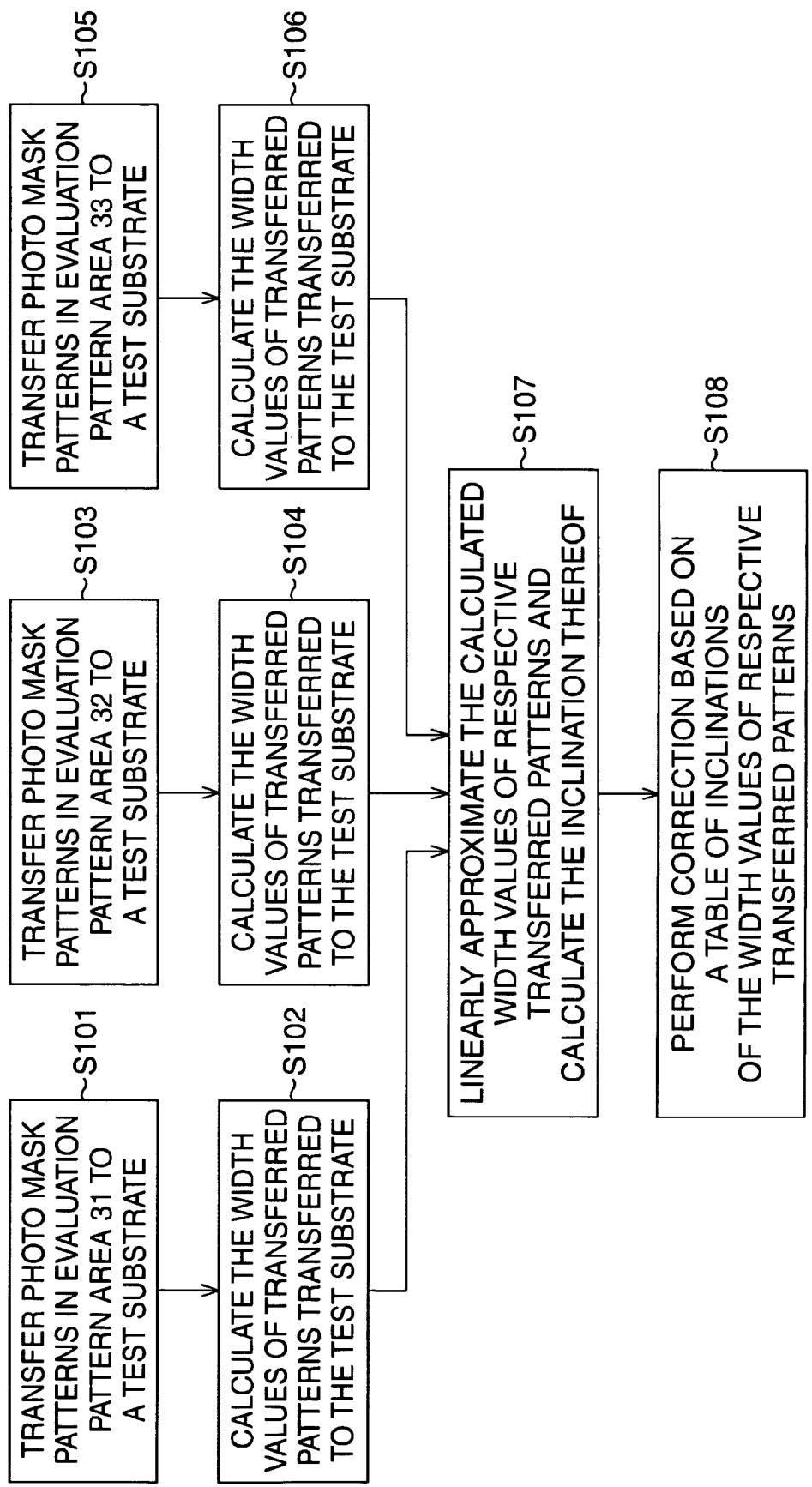
FIG. 4 is a flow chart illustrating the method for correcting pattern dimension according to the present embodiment.

FIG. 4 is a flow chart illustrating the pattern-dimension correcting method according to the present embodiment.

First, photolithography is performed with the evaluation pattern area 31 of the test photo mask 11 to transfer the mask pattern to a test substrate (not shown) including a photo resist formed thereon (step S101). Then, the width of the transferred pattern of the evaluation pattern 21 transferred on the test substrate is calculated by the first calculating unit 12 (step S102).

Then, photolithography is performed with the evaluation pattern area 32 of the test photo mask 11 to transfer the mask pattern to a test substrate (not shown) including a photo resist formed thereon (step S103). Then, the width of the transferred pattern of the evaluation pattern 21 transferred on the test substrate is calculated by the first calculating unit 12 (step S104).

Then, photolithography is performed with the evaluation pattern area 33 of the test photo mask 11 to transfer the mask pattern to a test substrate (not shown) including a photo resist formed thereon (step S105). Then, the width of the transferred pattern of the evaluation pattern 21 transferred on the test substrate is calculated by the first calculating unit 12 (step S106).

Figure 5:
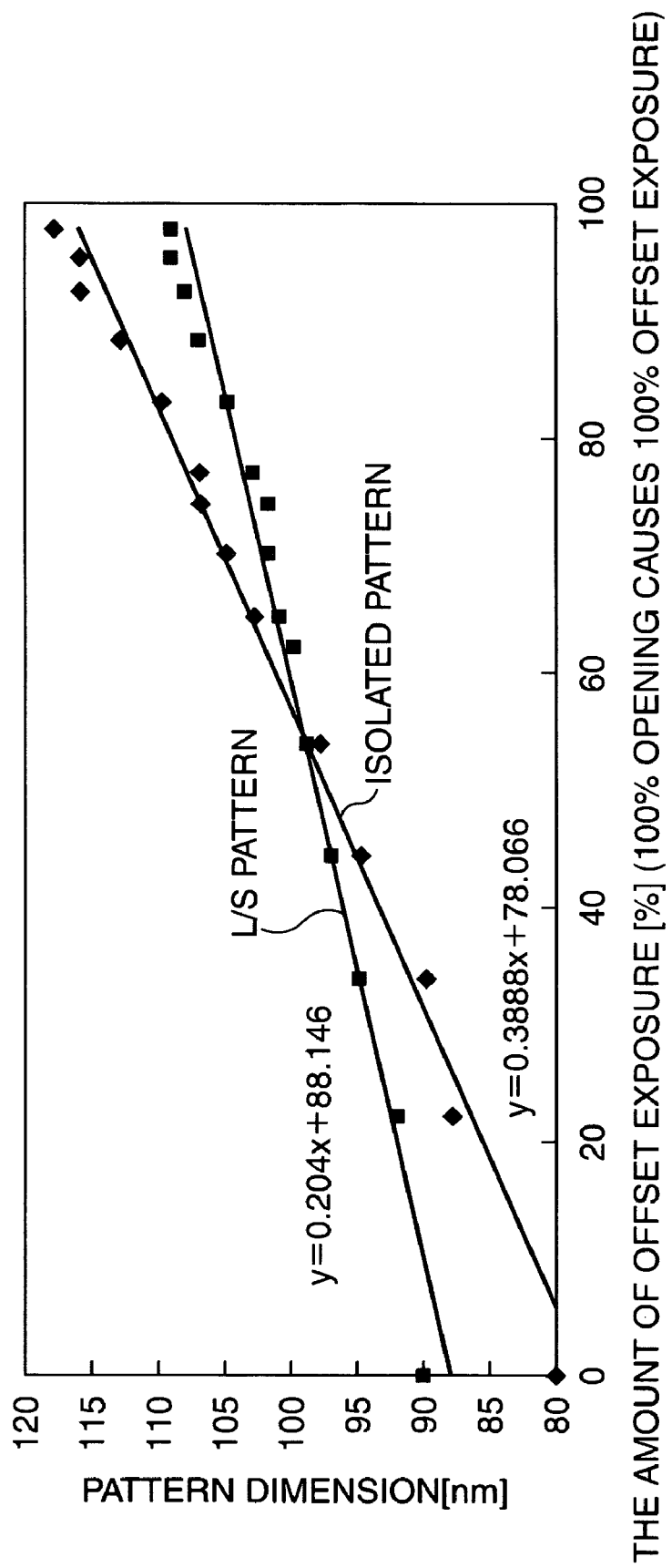
FIG. 5 is a characteristic view illustrating the relationship between the width of a transferred pattern and the opening ratio of flare generation patterns (the amount of offset exposure [%]).

Then, as illustrated in FIG. 5, the width values of the transferred patterns of the respective evaluation patterns 21 calculated at the steps S102, S104 and S106 are plotted on the basis of the relationship with the opening ratio of the flare generation pattern (the amount of offset exposure [%]), and the distribution of them is linearly approximated and the inclination thereof is calculated by the second calculating unit 13 (step S107). While there is illustrated in FIG. 4 the case of calculating three transferred-pattern width values, the width values of four or more transferred patterns may be calculated and the inclination may be calculated from the distribution of them.

Then, the inclination (the amount of dimension fluctuation) of the width values of the transferred patterns calculated at the step S107 is represented as a table and the amount of correction is varied by the correcting unit 14 for each pattern to be actually formed on the basis of the table (step S108).

Similarly, photolithography is performed with the evaluation pattern areas 34 to 36 of the test photo mask 11 to transfer the mask patterns to test substrates (not shown) including a photo resist formed thereon. Then, the width values of the respective transferred patterns of the evaluation patterns 22 are calculated by the first calculating unit 12. Then, as illustrated in FIG. 5, the calculated width values of the transferred patterns for the respective evaluation patterns 21 are plotted on the basis of the relationship with the opening ratio of the flare generation pattern (the amount of offset exposure [%]), and they are linearly approximated and the inclination thereof is calculated by the second calculating unit 13.

While "isolated patterns" and "L/S patterns" have been exemplified as the evaluation patterns herein, the aforementioned operations are actually performed by using patterns having different light-intensity inclinations used as practical device patterns, such as isolated patterns having various widths, L/S patterns having various widths and various distances between adjacent patterns, I-shaped and T-shaped butt patterns (hereinafter, simply referred to as I-shaped patterns and T-shaped patterns).

Figure 6:
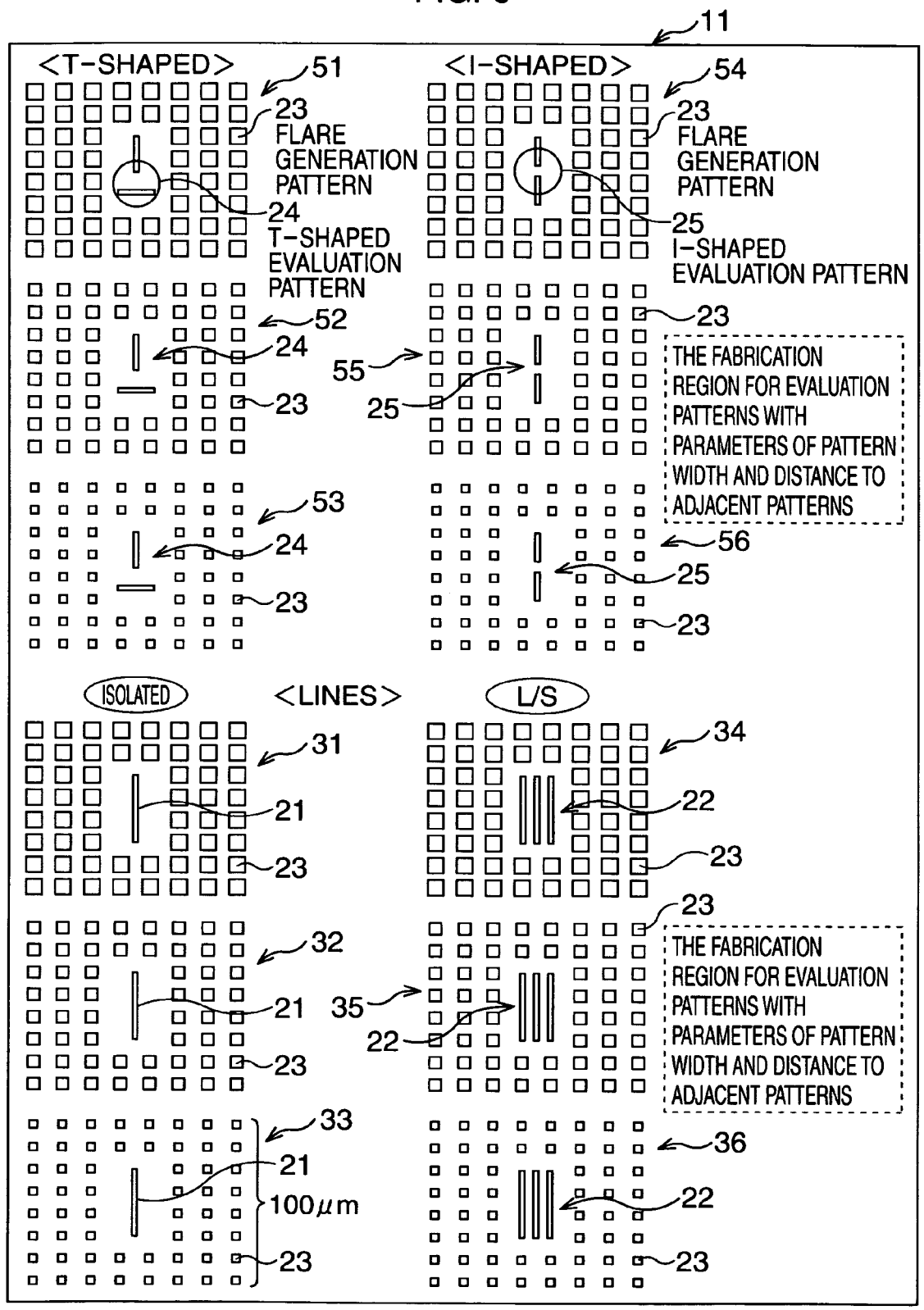
FIG. 6 is a schematic structure view of a test photo mask.

More specifically, for example, as illustrated in FIG. 6, the steps S101 and S108 are performed by using a test photo mask 11 including evaluation pattern areas 31 to 33 having evaluation patterns 21 which are isolated patterns, evaluation pattern areas 34 to 36 having evaluation patterns 22 which are L/S patterns (designated comprehensively as "lines" in the figure), evaluation pattern areas 51 to 53 having evaluation patterns 24 which are T-shaped patterns (designated as "T" in the figure), and evaluation pattern areas 54 to 56 having evaluation patterns 25 which are I-shaped patterns (designated as "I" in the figure), wherein these evaluation pattern areas are integrally formed. The flare generation patterns 23 are provided around the evaluation patterns in the respective evaluation pattern areas for making the opening ratios thereof to be different from one another, similarly to FIG. 3.

FIGS. 7A to 7C are views illustrating exemplary LFC tables. FIG. 7A is an LFC table relating to isolated patterns and L/S patterns (simply designated as "LINE" in the figure). FIG. 7B is an LFC table relating to I-shaped patterns. FIG. 7C is an LFC table relating to T-shaped patterns. The LFC tables for I-shaped patterns and T-shaped patterns are created since I-shaped patterns and T-shaped patterns have different light-intensity distributions from those for the same width values of isolated patterns and L/S patterns (the width values of L/S patterns are the width values of the center portions thereof).

These LFC tables represent the inclinations determined at the step S107 with respect to the parameters of the pattern width (line) and the distance to a most adjacent pattern (space). The respective LFC tables represent the inclination values determined at the step S107 in correspondence with Line equal to or more than 0.10 but less than 0.11, the Line equal to or more than 0.11 but less than 0.12, and Line equal to or more than 0.12, and Space equal to or more than 0.13 but less than 0.15, the Space equal to or more than 0.15 but less than 0.18 and the Space equal to or more than 0.18. In the LFC table in FIG. 6A, the Space equal to or more than 0.13 but less than 0.15 and the Space equal to or more than 0.15 but less than 0.18 correspond to the aforementioned inclinations for L/S patterns while the Space equal to or more than 0.18 corresponds to the aforementioned inclination for isolated patterns.

Also, such LFC tables may be determined by utilizing a light-intensity simulation. The light-intensity distributions for isolated patterns and L/S patterns corresponding to the aforementioned "evaluation patterns" may be determined by utilizing an existing simulation tool. The amount of pattern-dimension fluctuations with respect to a unit offset exposure amount variation is proportional to the inverse of an inclination near $E_{th}$ in a light-intensity distribution and therefore LFC tables may be created based on the inclination.

In the correction of the dimension of the mask pattern of a photo mask, the effective opening ratio (the amount of offset exposure) is determined utilizing the area-density map method. Further, the corrections for the respective sides of evaluation patterns is performed utilizing the determined effective opening ratio $\alpha$, an inclination value in the LFC table (LFC table value) k which is the amount of the fluctuation in the width values of transferred patterns to the pattern opening ratio, and a reference effective opening ratio (a reference amount of offset exposure) $\alpha_0$. The amount of correction is represented as $(-\frac{1}{2})* k(\alpha-\alpha_0)$.

Hereinafter, description thereof will be given by representing concrete examples.

Figure 8:
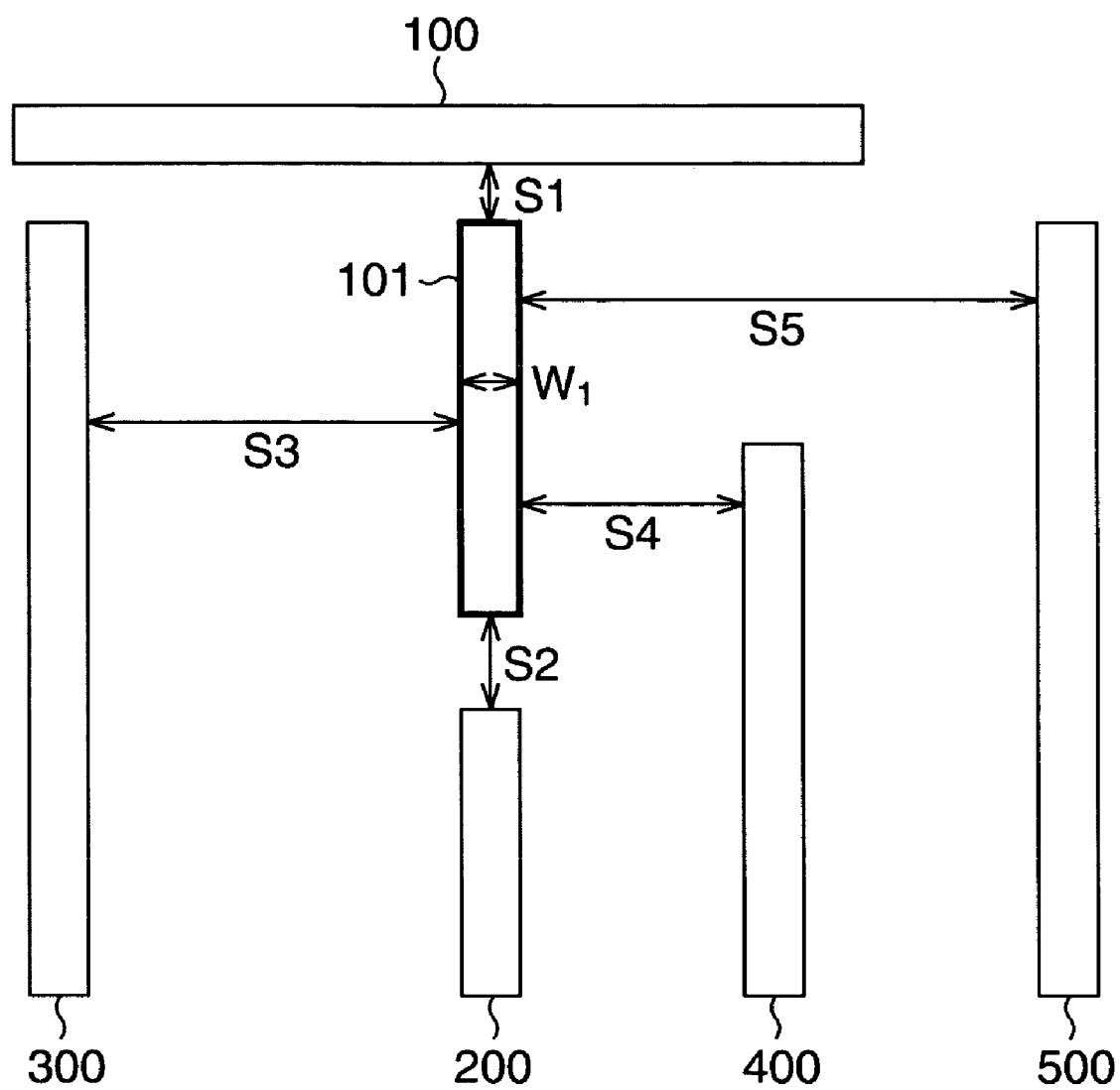
FIG. 8 is a schematic structure view illustrating dimension correction of a photo mask pattern utilizing LFC tables.

FIG. 8 is a schematic view illustrating the correction of photo-mask pattern dimensions. In this figure, the portion enclosed in the thick frame is the to-be-corrected pattern 101.

For the upper side of the to-be-corrected pattern 101, namely the side of the to-be-corrected pattern 101 adjacent to a first pattern 100, the correction is performed on the basis of an LFC table relating to T-shaped patterns with a pattern width of W1 and a distance to adjacent patterns of S1. The amount of correction is determined as $(-\frac{1}{2})*k_1(\alpha_1-\alpha_0)$, wherein the LFC table value is $k_1$, the effective opening ratio (the amount of offset exposure) is $\alpha_1$ and the reference effective opening ratio (the reference amount of offset exposure) is $\alpha_0$.

For the portion of the right side of the to-be-corrected pattern 101 to which a fifth pattern 500 is most adjacent, the correction is performed on the basis of an LFC table relating to line-shaped patterns with a pattern width of W1 and a distance to adjacent patterns of S5. The amount of correction is determined as $(-\frac{1}{2})*k_2(\alpha_2-\alpha_0)$, wherein the LFC table value is $k_2$, the effective opening ratio (the amount of offset exposure) is $\alpha_2$ and the reference effective opening ratio (the reference amount of offset exposure) is $\alpha_0$. Also, for the portion to which a fourth pattern 400 is most adjacent, the correction is performed on the basis of an LFC table relating to line-shaped patterns with a pattern width of W1 and a distance to adjacent patterns of S4. The amount of correction is determined as $(-\frac{1}{2})*k_3(\alpha_3-\alpha_0)$, wherein the LFC table value is $k_3$, the effective opening ratio (the amount of offset exposure) is $\alpha_3$ and the reference effective opening ratio (the reference amount of offset exposure) is $\alpha_0$.

For the lower side of the to-be-corrected pattern 101, namely the side of the to-be-corrected pattern 101 adjacent to a second pattern 200, the correction is performed on the basis of an LFC table relating to an I-shaped pattern with a pattern width of W1 and a distance to adjacent patterns of S2. The amount of correction is determined as $(-\frac{1}{2})*k_4(\alpha_4-\alpha_0)$, wherein the LFC table value is $k_4$, the effective opening ratio (the amount of offset exposure) is $\alpha_4$ and the reference effective opening ratio (the reference amount of offset exposure) is $\alpha_0$.

For the left side of the to-be-corrected pattern 101 adjacent to a third pattern 300, the correction is performed on the basis of an LFC table relating to a line-shaped pattern with a pattern width of W1 and a distance to adjacent patterns of S3. The amount of correction is determined as $(-\frac{1}{2})*k_5(\alpha_5-\alpha_0)$, wherein the LFC table value is $k_5$, the effective opening ratio (the amount of offset exposure) is $\alpha_5$ and the reference effective opening ratio (the reference amount of offset exposure) is $\alpha_0$.

Subsequently, the OPC is performed for correcting OPE and the amount of local-flare correction is optimized in consideration of MEEF (Mask Error Enhancement Factor), the MEEF being the ratio of the amount of resist-pattern dimension fluctuation to the amount of photo-mask dimension variation when the dimension of a photo mask is varied by a certain amount.

As described above, according to the present embodiment of the present invention, the width values of the transferred patterns of respective evaluation patterns transferred using the test photo mask are calculated on the basis of the relationship with the opening ratio of flare generation patterns. The distribution of the calculated width values of the respective transferred patterns is linearly approximated and the inclination thereof is calculated. Consequently, the amount of dimension fluctuations caused by local flares can be accurately calculated. This enables accurately performing pattern-dimension corrections against local flares.

The Second Embodiment

Next, the second embodiment will be described. While in the first embodiment the correction of pattern dimensions is performed by performing the local flare correction (LFC) and then performing the optical proximity effect correction (OPC), in the second embodiment the OPC is performed and then the LFC is performed. In the case of performing the LFC after the OPC, the correction values are not optimized by the OPC and therefore LFC tables as illustrated in the first embodiment can not be utilized.

Therefore, as a concrete method, the width values of the transferred patterns of evaluation patterns are plotted on the basis of the relationship with the opening ratio of the flare generating patterns (the amount of offset exposure [%]) similarly to the first embodiment. Further, the amount of fluctuations in the width values of the transferred patterns with respect to a unit opening ratio (a unit amount of offset exposure [%]) are determined and then the amounts of fluctuations divided by the MEEF of the respective patterns are used as LFC table values.

The Third Embodiment

Next, the third embodiment will be described. In the third embodiment, when performing the pattern dimension corrections of rule base using tables, the OPC and the LFC are concurrently performed. In the present embodiment, both OPC tables and LFC tables are prepared.

More specifically, for each pattern shape, an OPC table and an LFC table with the parameters of the pattern width and the distance to adjacent patterns are created. As the LFC table values, the fluctuation values in transferred pattern widths with respect to a unit opening ratio variation (a unit amount of offset exposure [%]) divided by the MEEF of the patterns are assigned, similarly to the second embodiment.

In the correction of photo-mask pattern dimensions, the effective opening ratio (the amount of offset exposure) is determined utilizing the area-density map method. The corrections for the respective sides of actual device patterns is performed utilizing the determined effective opening ratio $\alpha$, the LFC table value k, a reference effective opening ratio (a reference amount of offset exposure) $\alpha_0$ and an OPC table value c. In the case of linearly approximating the amount of dimension fluctuations caused by local flares, the amount of correction is represented as $c+(-\frac{1}{2})*k(\alpha-\alpha_0)$.

In order to avoid shorts, in OPCs, tip-end correction values may be restricted or tip-end shapes may be changed when the distances to adjacent patterns are below a certain value, in some cases (refer to Patent Document 2). In the case of concurrently performing the LFC and the OPC as in the present embodiment, tip-end correction values may be restricted or tip-end shapes may be changed when the resultant distances to adjacent patterns, as a result of the both the corrections, are below a "certain value". It is ideal that the "certain value" can be changed corresponding to the effective opening ratio (the amount of offset exposure). This is because the minimum space value ensuring a margin against shorts varies with the amount of flares.

While in the present embodiment the amount of correction is calculated with linear approximation, it is also possible to perform matching to a second-order equation and to represent the coefficients thereof in a table. For example, in the case of matching to $ax^2+bx+c$, a and b are represented in a table and the amount of correction is determined as $(-½)\{a(\alpha-\alpha_0)^2+b(\alpha-\alpha_0)\}$. Also, it is possible to perform matching to a third or higher order equation, as well as a second-order equation, and to represent the coefficients thereof in a table. While in the present embodiment the test photo mask is a single photo mask including a plurality of evaluation pattern areas formed thereon, a plurality of photo masks may be formed to perform the aforementioned evaluation.

The Fourth Embodiment

Next, the fourth embodiment will be described. In the fourth embodiment, there will be exemplified the case where the patterns to be actually subjected to pattern-dimension corrections are restricted to patterns to be formed in a certain region (in this case, an active region) of a semiconductor chip.

In general, a semiconductor device includes an active region (which is a device formation region defined by device separation constructions such as field oxide films formed by an LOCOS method or trenches filled with insulator materials which are formed by an STI (Shallow Trench Isolation) method in device separation regions) in which gate patterns for a gate electrode and gate wiring are formed by photolithography. Such gate patterns in the active region are line patterns, and therefore, in the present embodiment, the pattern-dimension correction described in the first embodiment are restricted to gate patterns in an active region and LFC tables for only isolated patterns and L/S patterns are utilized.

A pattern-dimension correcting apparatus according to the present embodiment is similar to that of the first embodiment and is constituted by fluctuation amount evaluation unit 10 including a test photo mask 11, first calculation unit 12 and second calculation unit 12 and correction unit 14, as illustrated in FIG. 2. The pattern-dimension correction according to the present embodiment is similar to that of the first embodiment and includes performing steps S101 to S108, as illustrated in FIG. 4.

The test photo mask 11 for use in the present embodiment is not required to be a photo mask as that in FIG. 6 described in the first embodiment, and is only required to be a photo mask as illustrated in FIG. 3, for example. Namely, according to the present embodiment, it is only necessary to determine the relationship between the amount of local flares and the amount of dimension fluctuations in evaluation patterns 21, 22 only for isolated patterns and S/L patterns in the test photo mask 11 and to create only an LFC table as illustrated in FIG. 7A.

Figure 9:
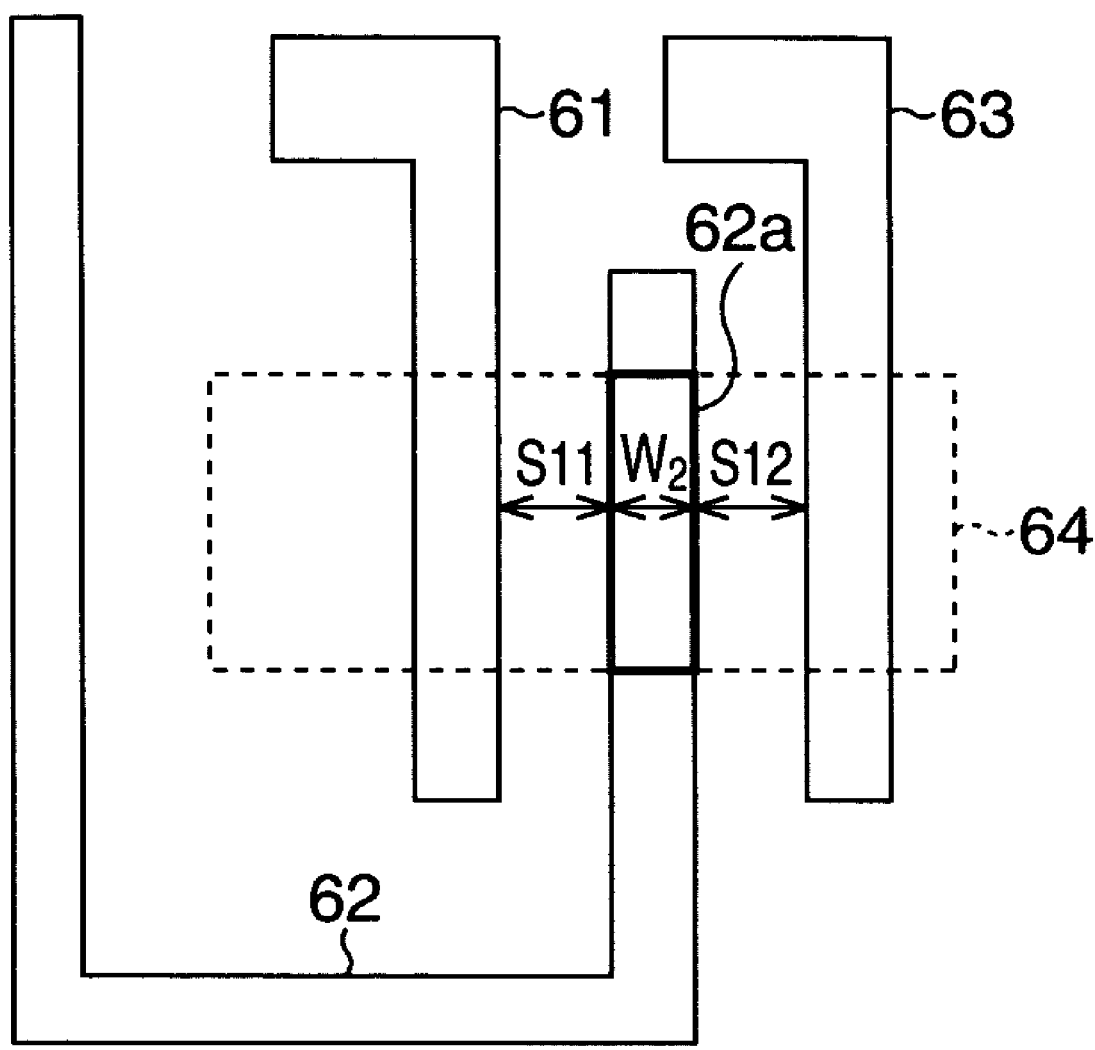
FIG. 9 is a schematic structure view illustrating dimension correction of a photo mask pattern utilizing LFC tables according to the present embodiment.

FIG. 9 is a schematic view illustrating the photo mask pattern dimension correction utilizing an LFC table according to the present embodiment.

In the figure, the portions illustrated by solid lines are gate patterns 61, 62, 63 and the portion illustrated by a broken line is an active region 64. In an actually fabricated semiconductor device, the active region 64 is defined by device separation constructions. There will be described, as an example, the case of correcting the width dimension of the gate pattern 62. In the present embodiment, in order to perform the correction utilizing the table illustrated in FIG. 7A, for example, for the portion of the gate pattern 62 which lies on the active region 64, at first, the portion of the gate pattern 62 which is overlaid on the active region 64 is extracted. The portion illustrated in a thick frame in the figure is the extracted overlaid portion 62a. The width value $W_2$ of the overlaid portion 62a is measured.

Then, the correction for the left side of the overlaid portion 62a is performed based on, for example, the LFC table of FIG. 7A defining the amount of the dimension fluctuation to the amount of flares with parameters of the width value $W_2$ and the distance S11 to the gate pattern 61 which is the most adjacent pattern. In the case of linearly approximating the amounts of dimension fluctuations caused by local flares, the amount of correction is determined as $(-½)*k_6(\alpha_6-\alpha_0)$, wherein the LFC table value is $k_6$, the effective opening ratio is $\alpha_6$ and the reference effective opening ratio (the reference amount of offset exposure) is $\alpha_0$.

Then, the correction for the right side of the overlaid portion 62a is performed, on the basis of, for example, the LFC table of FIG. 7A defining the amount of the dimension fluctuation to the amount of flares with parameters of the aforementioned width value $W_2$ and the distance S12 to the gate pattern 63 which is the most adjacent pattern. In the case of linearly approximating the amounts of dimension fluctuations caused by local flares, the amount of correction is determined as $(-½)*k_7(\alpha_7-\alpha_0)$, wherein the LFC table value is $k_7$, the effective opening ratio is $\alpha_7$ and the reference effective opening ratio (the reference amount of offset exposure) is $\alpha_0$.

Consequently, appropriate local-flare corrections can be performed for the gate patterns in the active region 64 having particularly large influences on the transistor characteristics, thereby significantly improving the dimension accuracy of the gate patterns.

On the other hand, the patterns which lie outside of the active region, namely the portions of the gate patterns 61 to 63 which lie on the inactive region (which is, for example, the portion on device separation constructions in an actually-fabricated semiconductor device) in the illustrated example, is loose for the required specifications about dimension accuracy in comparison with the portions on the active region 64 (for example, the overlaid portion 62a). Therefore, in the case of using an exposure apparatus causing a small amount of local flares, it is unnecessary to perform local-flare corrections for the patterns on the inactive region. Further, in the case of using an exposure apparatus causing a large amount of local flares, it is preferable to perform local-flare corrections with a constant amount of correction for the patterns in the inactive region.

In general, when entire gate patterns are subjected to width-dimension corrections, some patterns are difficult to correct. For example, so-called hammer heads are added to I-shaped butted portions of gate patterns by optical proximity effect corrections (OPC). In order to perform optimal corrections in such a case, there is a need for an LFC table taking account of hammer heads. However, this will cause problems that it requires a long time to acquire data and processes are complicated. In such a case, according to the present invention, it is possible to apply the local-flare correction described in the first embodiment to only the portions of gate patterns which overlaid on the active region as previously described, without taking account of hammer heads. Consequently, high-accuracy width-dimension corrections can be applied to only portions having large influences on the transistor characteristics and thus requiring strict specifications about dimension accuracy, within an extremely short time, and also entire gate patterns can be fabricated with sufficient accuracy.

As described above, according to the present embodiment, the width values of the transferred patterns of respective evaluation patterns transferred using the test photo mask are calculated on the basis of the relationship with the opening ratio of the flare generation patterns. Further, the distribution of the calculated width values of the respective transferred patterns is linearly approximated and the inclination thereof is calculated. Consequently, the amount of dimension fluctuations caused by local flares can be accurately calculated.

This enables performing accurate pattern-dimension corrections against local flares.

Furthermore, in this case, the amount of correction is changed for each pattern, only for patterns on an active region which require high dimension accuracy, which significantly reduces the time required for corrections. Further, a table about only line patterns as in FIG. 7A may be utilized as an LFC table, thus significantly easily realizing high-accuracy width-dimension corrections.

The pattern-dimension correcting apparatuses, the respective unit constituting the pattern-dimension correcting apparatuses and the respective steps (the step S101 to the step S108 in FIG. 4) in the pattern-dimension correcting methods according to the aforementioned embodiments can be realized by operating computer programs stored in RAMs or ROMs in computers. Such computer programs and computer-readable storage mediums storing such computer programs are included in the present invention.

More specifically, the aforementioned computer programs are stored in storage media such as CD-ROMs or provided to computers through various types of transfer media. As the storage media for storing the aforementioned computer programs, it is possible to employ flexible disks, hard disks, magnetic tapes, photomagnetic disks, non-volatile memory cards, etc., as well as CD-ROMs. Further, as the transfer media for the aforementioned computer programs, it is possible to employ communication media (for example, wired networks such as optical fibers and wireless networks) in computer network (LANs, WANs of the internet, wireless communication networks, etc.) systems for transferring program information as carrier waves.

The functions of the aforementioned embodiments may be realized by executing computer programs provided to computers. In addition, the functions of the aforementioned embodiments may be realized by executing the computer programs in cooperation with OS (operation systems) or other application software which are operated in the computer or by executing all or a portion of the provided computer programs utilizing a function expansion board or a function expansion unit. These cases are also included in the present invention.

Figure 10:
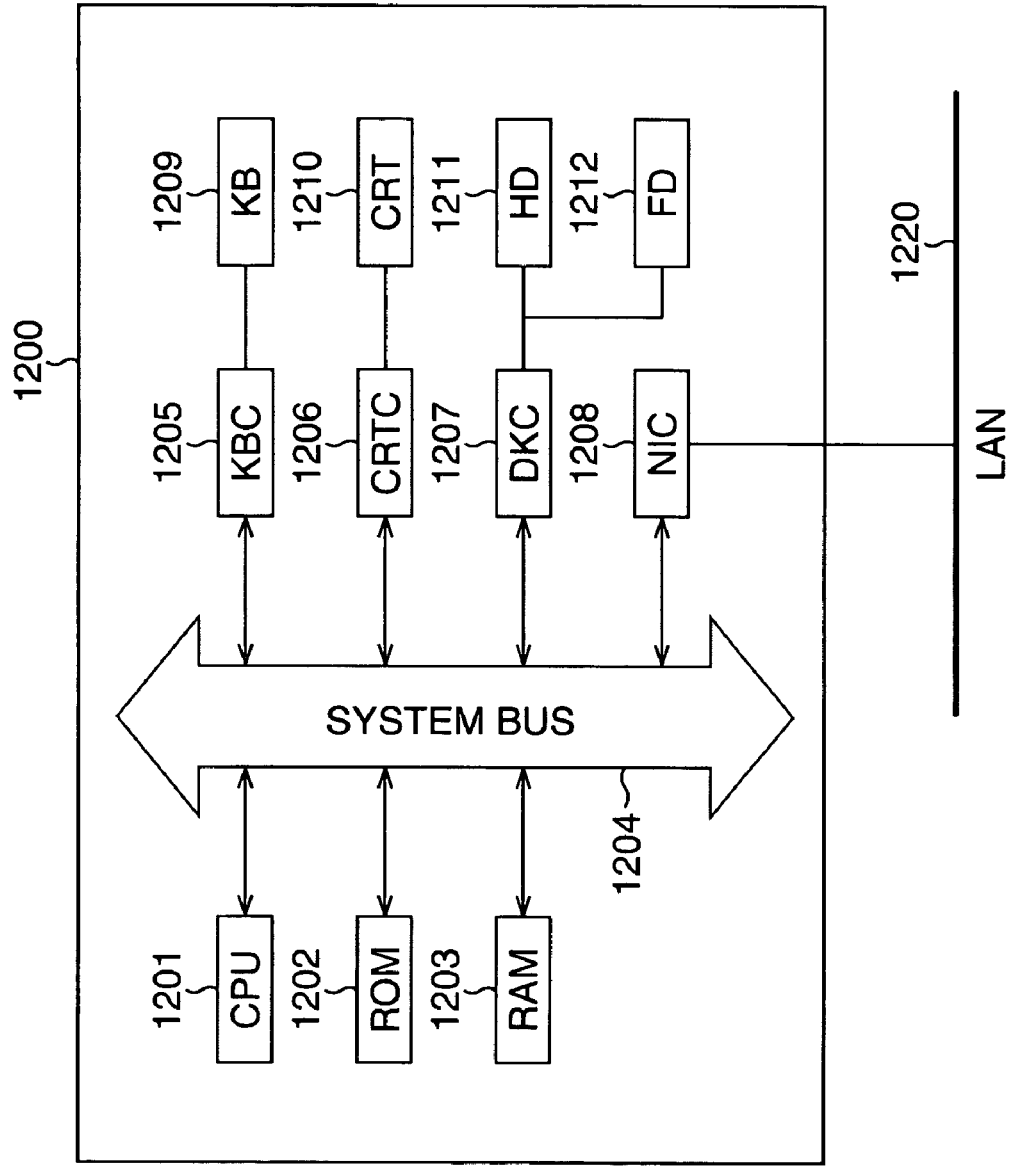
FIG. 10 is an internal structure view of a personal user terminal unit.
Figure 11A:
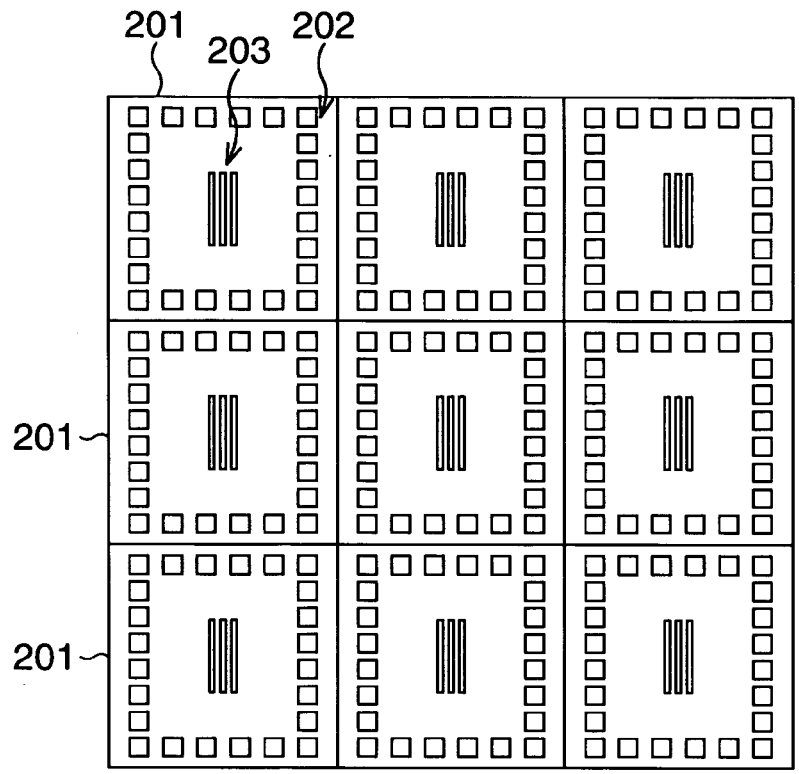
FIG. 11A is a schematic structure view of a photo-mask pattern.
Figure 11B:
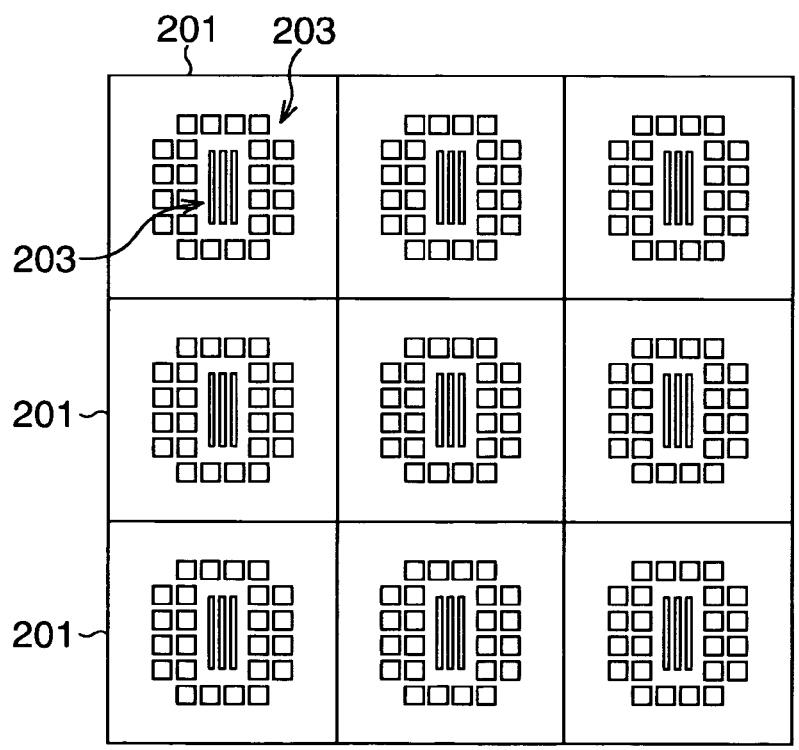
FIG. 11B is a schematic structure view of a photo-mask pattern.

For example, FIG. 10 is an internal structure diagram of a common personal user terminal unit. In FIG. 10, 1200 is a computer PC. The PC 1200 includes a CPU 1201 and executes device control software stored in a ROM 1202 or a hard disk (HD) 1211 or supplied from a flexible disk drive (FD) 1212 for overall controlling the respective devices connected to a system bus 1204.

INDUSTRIAL APPLICABILITY

According to the present invention, the width values of the transferred patterns of respective evaluation patterns transferred using the test photo mask are calculated on the basis of the relationship with the opening ratio of the flare generation patterns. The distribution of the calculated width values of the respective transferred patterns is linearly approximated and the inclination thereof is calculated. Consequently, the amount of dimension fluctuations caused by local flares can be accurately calculated. This enables performing accurate pattern-dimension corrections against local flares.

What is claimed is:

1. An apparatus for correcting pattern dimension that corrects local flares occurring in an exposing apparatus in fabricating a semiconductor device the apparatus comprising:

at least one unit to linearly approximate distributions of width values of transferred patterns by linearly approximating light-intensity as trapezoid waves, the linear approximation being based on parameters including pattern widths of evaluation patterns and distances from said evaluation patterns to most adjacent patterns, and to provide an amount of dimension fluctuation relative to an amount of said flares with inclinations of the trapezoid waves in a table, wherein the amount of correction is varied for each formed pattern based on the table.

2. The apparatus according to claim 1, wherein a test photo mask including a plurality of said evaluation patterns formed to have different said pattern widths and different said distances to adjacent patterns and flare generation patterns for generating local flares around respective said evaluation patterns is used to determine the relationship between the width values of transferred patterns of said evaluation patterns transferred through said test photo mask and said amount of flares, said relationship is linearly approximated to determine the inclination thereof and then the inclination is utilized for corrections of said flares.

3. An apparatus for correcting pattern dimension that corrects local flares occurring in an exposing apparatus in fabricating a semiconductor device, the apparatus comprising:

a fluctuation amount evaluation unit to evaluate the amount of the dimension fluctuation relative to the amount of said flares using parameters of the pattern widths of evaluation patterns and the distances from said evaluation patterns to most adjacent patterns; and a correction unit to linearly approximate distributions width values of transferred patterns by linearly approximating light-intensity as trapezoid waves, to provide the amount of the dimension fluctuation relative to the amount of said flares with the inclinations of the trapezoid waves in a table, and to change an amount of correction for each formed pattern based on the table.

4. The apparatus according to claim 3, wherein said fluctuation amount evaluation unit comprises a test photo mask including a plurality of said evaluation patterns formed to have different said pattern widths and different said distances to adjacent patterns as well as flare generation patterns for generating local flares around respective said evaluation patterns;

a first calculation unit to calculate the width values of transferred patterns of said evaluation patterns transferred through said test photo mask based on a relationship with an opening ratio of said flare generation patterns; and a second calculation unit to linearly approximate the distribution of the calculated width values of respective said transferred patterns, to calculate the inclination thereof and to utilize the inclination for corrections of said flares.

5. The apparatus according to claim 4, wherein said test photo mask includes a plurality of said flare generation patterns having different opening ratios for respective said evaluation patterns.

6. The apparatus according to claim 4, wherein a plurality of said flare generation patterns with rectangular shapes are placed around respective said evaluation patterns and said opening ratios are defined by the areas of respective said flare generation patterns.

7. A method for correcting pattern dimension that corrects local flares occurring in an exposing apparatus in fabricating a semiconductor device, the method comprising:

linearly approximating distributions of width values of transferred patterns by linearly approximating light-intensity as trapezoid waves, based on parameters including pattern widths of evaluation patterns and distances from said evaluation patterns to most adjacent patterns; and defining an amount of dimension fluctuation relative to an amount of said flares with inclinations of the trapezoid waves in a table, wherein the amount of correction is varied for each formed pattern based on the table.

8. The method according to claim 7, further comprising:
using a test photo mask including a plurality of said evaluation patterns formed to have different said pattern widths and different said distances to adjacent patterns and flare generation patterns for generating local flares around respective said evaluation patterns to determine the relationship between the width values of transferred patterns of said evaluation patterns transferred through said test photo mask and said amount of flares, said relationship is linearly approximated to determine the inclination thereof and then the inclination is utilized for corrections of said flares.

9. A method for correcting pattern dimension that corrects local flares occurring in an exposing apparatus in fabricating a semiconductor device, the method comprising:
linearly approximating distributions of width values of a transferred patterns by linearly approximating light-intensity as trapezoid waves,;

providing an amount of dimension fluctuation relative to an amount of said flares with inclinations of the trapezoid waves in a table;

evaluating the amount of the dimension fluctuation relative to the amount of said flares using parameters of pattern widths of evaluation patterns and distances from said evaluation patterns to most adjacent patterns; and changing the amount of correction for each formed pattern based on the table.

10. The method according to claim 9, wherein evaluating the amount of the dimension fluctuation relative to the amount of said flares includes first calculating, by using a test photo mask including a plurality of evaluation patterns formed to have different said pattern widths and different said distances to adjacent patterns as well as flare generation patterns for generating local flares around respective said evaluation patterns, the width values of transferred patterns of said evaluation patterns transferred through said test photo mask based on a relationship with an opening ratio of said flare generation patterns; and second calculating for corrections of said flares, by linearly approximating the distribution of the calculated width values of respective said transferred patterns, and by calculating the inclination.

11. The method according to claim 10, wherein said test photo mask includes a plurality of said flare generation patterns having different opening ratios for respective said evaluation patterns.

12. The method according to claim 10, wherein a plurality of said flare generation patterns with rectangular shapes are placed around respective said evaluation patterns and said opening ratios are defined by the areas of respective said flare generation patterns.

13. The method according to claim 10, wherein said first calculation step includes calculating the widths of said transferred patterns of respective said evaluation patterns having at least line shapes, I shapes and T shapes.

14. A method for exposing light onto an active region of a semiconductor substrate to transfer a pattern;
wherein a first mask pattern to be transferred to an active region has a mask line width including an amount of correction, the amount of correction being calculated on the basis of a correction table, in relation to a distance dimension to a second mask pattern which is adjacent to said first mask pattern within the same active region; and said correction table linearly approximates distributions of width values of transferred patterns by linearly approximating light-intensity as trapezoid waves, defines an amount of dimension fluctuation relative to an amount of flares with inclinations of the trapezoid waves, and is created from measured values of the transferred patterns formed by transferring patterns of a test photo mask onto a test substrate, said test photo mask including a plurality of flare generation patterns having different opening ratios and evaluation patterns having at least line shapes.

15. The method according to claim 14, wherein said first mask pattern has a hammer-head shape.

16. The apparatus according to claim 3, wherein said fluctuation amount evaluation unit comprises
a test photo mask including a plurality of said evaluation patterns formed to have different said pattern widths and different said distances to adjacent patterns as well as flare generation patterns for generating local flares around respective said evaluation patterns;

a first calculation unit to evaluate the width values of transferred patterns of said evaluation patterns transferred through said test photo mask based on a relationship with an opening ratio of said flare generation patterns; and a second calculation unit to linearly approximate the distribution of the evaluated width values of respective said transferred patterns based on a relationship with an opening ratio of said flare generation patterns, to calculate the inclination thereof and to utilize the inclination for corrections of said flares.

17. The apparatus according to claim 16, wherein said test photo mask includes a plurality of said flare generation patterns having different opening ratios for respective said evaluation patterns.

18. The apparatus according to claim 16, wherein a plurality of said flare generation patterns with rectangular shapes are placed around respective said evaluation patterns and said opening ratios are defined by the areas of respective said flare generation patterns.

* * * * *